(12) United States Patent
Lee et al.

(10) Patent No.: US 7,879,951 B2
(45) Date of Patent: Feb. 1, 2011

(54) ORGANIC INSULATOR COMPOSITION, ORGANIC INSULATING LAYER INCLUDING THE COMPOSITION, AND ORGANIC THIN FILM TRANSISTOR INCLUDING THE SAME

(75) Inventors: Eun Kyung Lee, Seoul (KR); Joo Young Kim, Suwon-si (KR); Jong Baek Seon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 40 days.

(21) Appl. No.: 12/219,195

(22) Filed: Jul. 17, 2008

(65) Prior Publication Data

US 2009/0206330 A1    Aug. 20, 2009

(30) Foreign Application Priority Data

Feb. 19, 2008    (KR) ...................... 10-2008-0014787

(51) Int. Cl.
*C08F 22/40*    (2006.01)
*H01L 29/00*    (2006.01)
*C08G 65/14*    (2006.01)

(52) U.S. Cl. .............. 525/326.8; 257/40; 257/E51.001; 528/87

(58) Field of Classification Search .................... 528/87
See application file for complete search history.

(56) References Cited

U.S. PATENT DOCUMENTS

| | | | |
|---|---|---|---|
| 2005/0001210 A1* | 1/2005 | Lee et al. | 257/40 |
| 2005/0127355 A1* | 6/2005 | Jeong et al. | 257/40 |
| 2006/0006553 A1* | 1/2006 | Fuller et al. | 257/790 |
| 2006/0151781 A1* | 7/2006 | Kim et al. | 257/40 |
| 2008/0067505 A1* | 3/2008 | Lee et al. | 257/40 |

* cited by examiner

*Primary Examiner*—Mark Eashoo
*Assistant Examiner*—David Karst
(74) *Attorney, Agent, or Firm*—Harness, Dickey & Pierce, PLC

(57) ABSTRACT

An organic insulator composition according to example embodiments may include an organic insulating polymer and an epoxy-based crosslinking agent. The epoxy-based crosslinking agent may have an alkyl group or a fluorine-based side chain. The organic insulator composition may be used to form an organic insulating layer having increased chemical resistance. The organic insulating layer may be used in an organic thin film transistor as a gate insulating layer. Consequently, the occurrence of hysteresis may be reduced or prevented during the operation of the organic thin film transistor, thus resulting in relatively homogeneous properties.

17 Claims, 3 Drawing Sheets

ORGANIC INSULATOR COMPOSITION, ORGANIC INSULATING LAYER INCLUDING THE COMPOSITION, AND ORGANIC THIN FILM TRANSISTOR INCLUDING THE SAME

PRIORITY STATEMENT

This application claims priority under U.S.C. §119 to Korean Patent Application No. 10-2008-0014787, filed on Feb. 19, 2008 in the Korean Intellectual Property Office (KIPO), the entire contents of which are incorporated herein by reference.

BACKGROUND

1. Technical Field

Example embodiments relate to an insulator composition, an insulating layer including the composition, and a transistor including the same.

2. Description of the Related Art

A thin film transistor (TFT) has been used as a switching device and a driving device for pixels in a flat panel display (e.g., liquid crystal display (LCD), electroluminescence display (ELD)). A TFT may also be applied to a plastic chip so as to function as a smart card or an inventory tag.

A conventional TFT may include a source area and a drain area doped with an increased concentration of impurities. A semiconductor layer having a channel area may be formed between the source and drain areas. A gate electrode may be disposed in an area which corresponds to the channel area while being insulated from the semiconductor layer. A source electrode and a drain electrode may contact the source area and the drain area, respectively.

A conventional TFT channel layer was previously made of an inorganic semiconductor material (e.g., silicon (Si)). However, an inorganic-based material involves a higher temperature vacuum process, thus increasing costs. As a result, the inorganic-based material was replaced with an organic-based semiconductor material. The use of an organic-based semiconductor material also enables the enlargement, cost-reduction, and softening of display devices. Accordingly, there has been increased research regarding an organic thin film transistor (OTFT) using an organic layer as a semiconductor layer.

A conventional OTFT may have a thin film as an insulating layer. The thin film may be formed with a relatively inexpensive solution procedure (e.g., spin coating). However, trap charges may occur at an interface of the thin film because of the intrinsic characteristics of an organic-based material. Additionally, hysteresis may be caused by polarization resulting from external moisture along a sweep direction of the gate voltage. For example, when applying a voltage to a gate electrode, the magnitude of the current between the source electrode and the drain electrode may correspond to the magnitude of the applied voltage. However, the magnitude of the current in a conventional OTFT may not be homogeneously maintained because of hysteresis.

Furthermore, conventional organic insulator compositions used for the gate insulating layer have relatively poor resistance to etchants, photoresist strippers, and other chemicals used in the fabrication process, thus rendering it difficult to maintain the original properties of the gate insulating layer.

SUMMARY

Example embodiments relate to an organic insulator composition having increased chemical resistance. The organic insulator composition may be used to form an organic insulating layer. As a result, the organic insulating layer may have improved fabrication processability. Additionally, the organic insulating layer may be utilized in an organic thin film transistor (OTFT). Consequently, the occurrence of hysteresis may be reduced or prevented during the operation of the OTFT.

An organic insulator composition according to example embodiments may include an epoxy-based crosslinking agent and an organic insulating polymer represented by Formula 1 below:

Formula 1

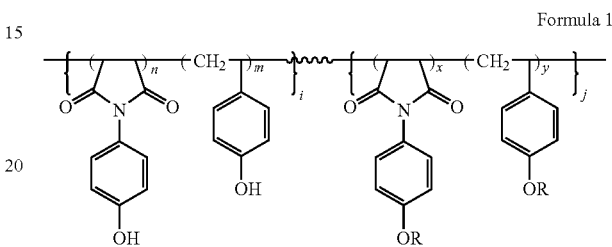

wherein

R is represented by Formula 2 below;

m, n, x, and y are real numbers ranging from about 0.1 to about 0.9;

i and j are each real numbers ranging from about 0 to about 1, with j≠0;

Formula 2

wherein $R_1$ is selected from at least one of the functional groups represented by Formula 3 below;

$R_2$ is selected from the photo-reactive functional groups represented by Formula 4 below;

k is an integer ranging from about 0 to about 3; and if $R_1$ is plural, they are identical to or different from each other;

Formula 3

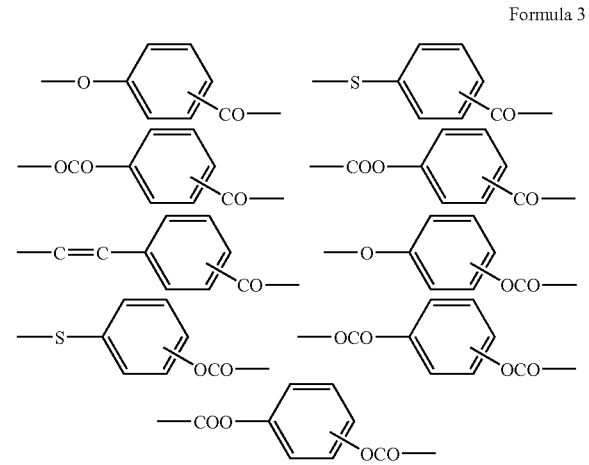

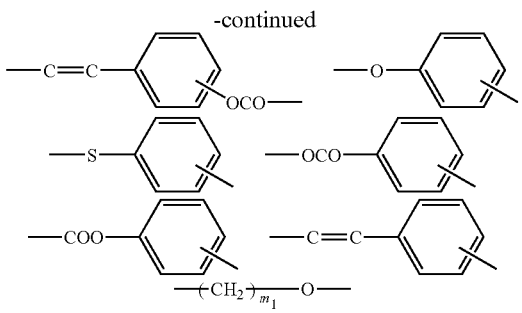

-continued wherein $m_1$ is an integer ranging from about 1 to about 12;

Formula 4

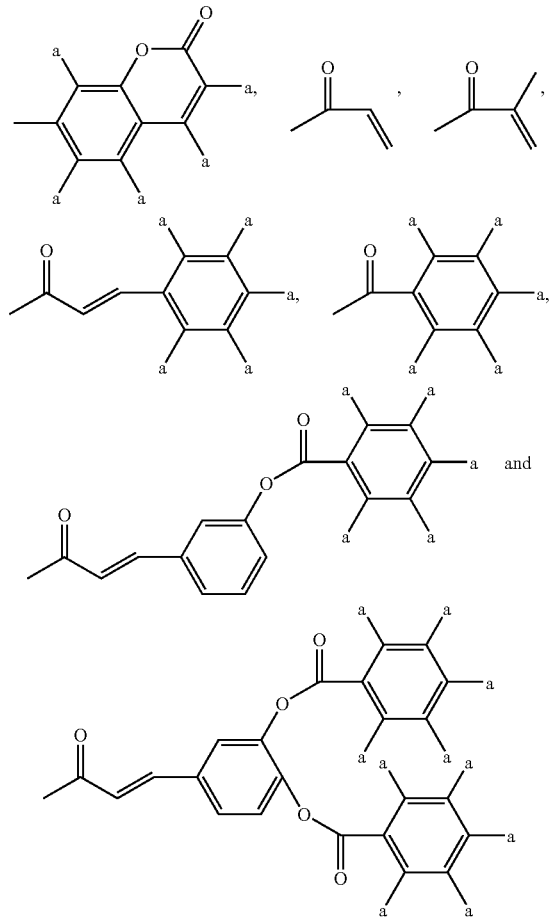

wherein a is selected from at least one of hydrogen, fluorine, chlorine, and a $C_{3-12}$ alkyl group.

Referring to Formula 1, the sum of m and n, the sum of x and y, and the sum of i and j may be about 1. The epoxy-based crosslinking agent may constitute about 10~50 parts by weight based on 100 parts by weight of the organic insulating polymer.

An organic insulating layer may be prepared using the organic insulator composition according to example embodiments. Furthermore, an OTFT may include the organic insulating layer as a gate insulating layer. For example, an OTFT may include a gate electrode, a gate insulating layer, an organic semiconductor layer, and source/drain electrodes sequentially disposed on a substrate.

BRIEF DESCRIPTION OF THE DRAWINGS

Example embodiments may be better appreciated in view of the following detailed description in conjunction with the accompanying drawings.

FIG. 1 is a cross-sectional view of an organic thin film transistor (OTFT) according to example embodiments;

FIG. 2 is a current transfer characteristic curve of the OTFT fabricated in Example 1 according to example embodiments;

FIG. 3 is a current transfer characteristic curve of the OTFT fabricated in Example 2 according to example embodiments;

FIG. 4 is a current transfer characteristic curve of the OTFT fabricated in Example 3 according to example embodiments;

FIG. 5 is a current transfer characteristic curve of the OTFT fabricated in Comparative Example 2; and FIG. 6 is a current transfer characteristic curve of the OTFT fabricated in Comparative Example 3.

Figure 1:
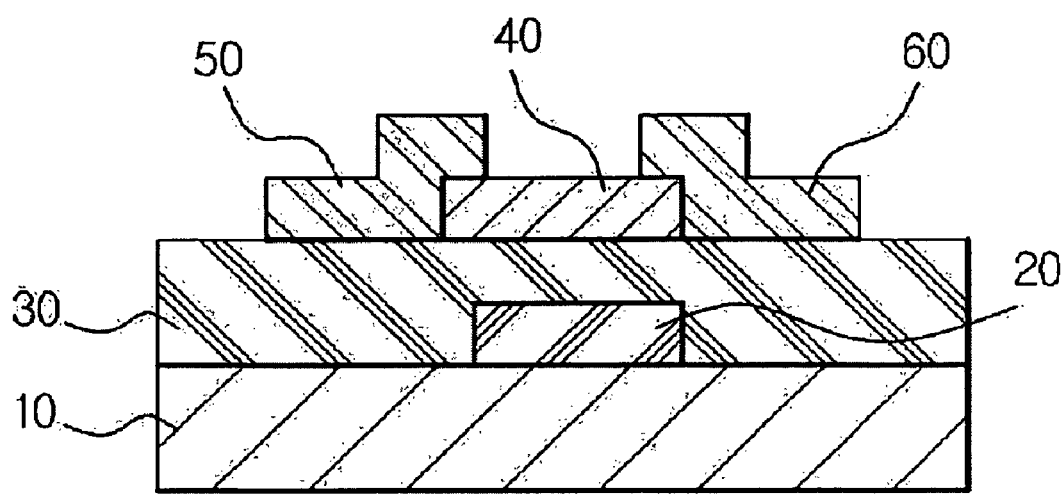
FIGS. 1-6 represent non-limiting, example embodiments of the present application.

It should be understood that the figures are merely intended to illustrate the general characteristics of various materials, structures, and/or methods disclosed herein according to example embodiments. Thus, the figures may not have been drawn to scale and may not reflect the precise structural or performance characteristics. For instance, the relative thicknesses and positioning of molecules, layers, regions, and/or structural elements may have been reduced or exaggerated for clarity. Accordingly, the figures should not be interpreted as defining or limiting the range of values or properties encompassed by example embodiments.

DETAILED DESCRIPTION OF EXAMPLE EMBODIMENTS

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

An organic insulator composition according to example embodiments may include an organic insulating polymer and an epoxy-based crosslinking agent. When the composition is used in an organic insulating layer of an organic thin film transistor (OTFT), the properties (e.g., charge mobility, $I_{on}/I_{off}$) of the OTFT may be improved. Additionally, hysteresis may be decreased, thus increasing homogeneity and stability of the OTFT.

The organic insulating polymer according to example embodiments may be represented by Formula 1 below:

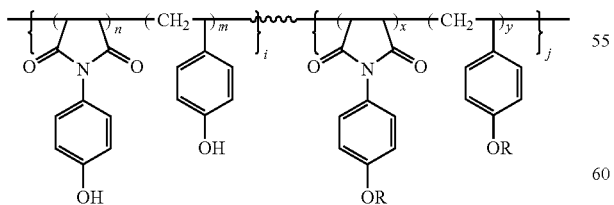

Formula 1 wherein
R may be represented by Formula 2 below;
m may be a real number ranging from about 0.1 to about 0.9, and n may be a real number ranging from about 0.1 to about 0.9, with the sum of m and n being about 1;

x may be a real number ranging from about 0.1 to about 0.9; and y may be a real number ranging from about 0.1 to about 0.9, with the sum of x and y being about 1;
i and j may each be real numbers ranging from about 0 to about 1 (j≠0) with the sum of i and j being about 1;

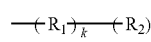

Formula 2 wherein
$R_1$ may be selected from the functional groups represented by Formula 3 below;
$R_2$ may be selected from the photo-reactive functional groups represented by Formula 4 below;
k may be an integer ranging from about 0 to about 3; and
if $R_1$ is plural, they may be identical to or different from each other;

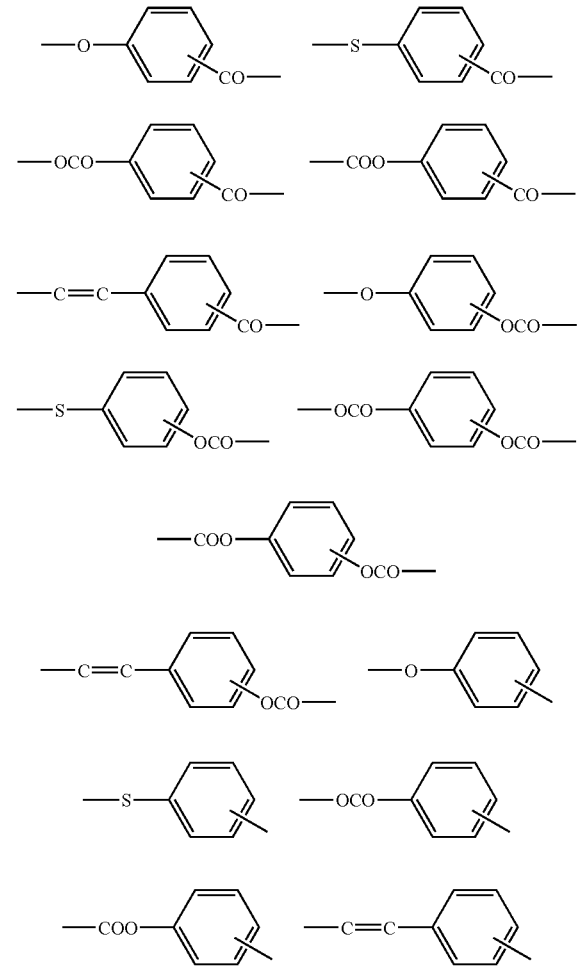

Formula 3

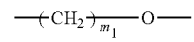

wherein
  $m_1$ may be an integer ranging from about 1 to about 12;

Formula 4

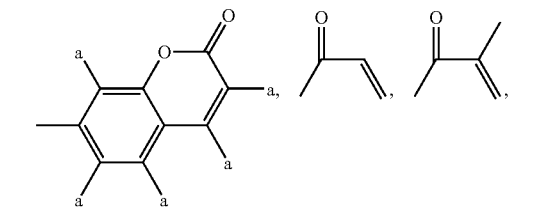

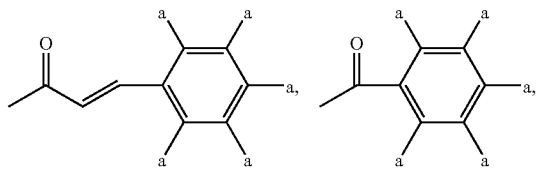

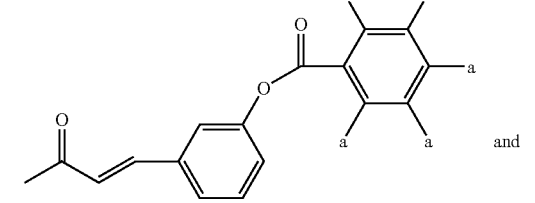

and

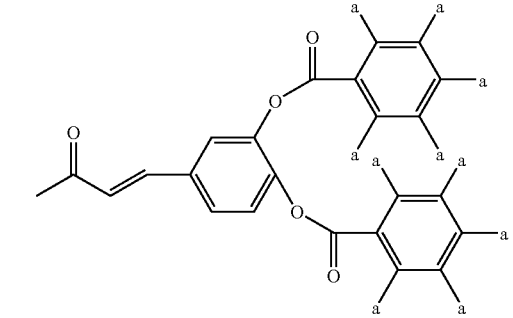

wherein
  a may be selected from hydrogen, fluorine, chlorine, and/or a $C_{3-12}$ alkyl group.

The organic insulating polymer of Formula 1 may be further represented by Formula 5 below:

Formula 5

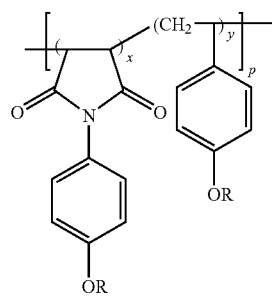

wherein
  R may be as defined in Formula 1;
  x and y may be as defined in Formula 1;
  p may be a real number ranging from about 10 to about 200;

The organic insulating polymer of Formula 5 may be further represented by Formulas 6, 7, or 8 below:

Formula 6

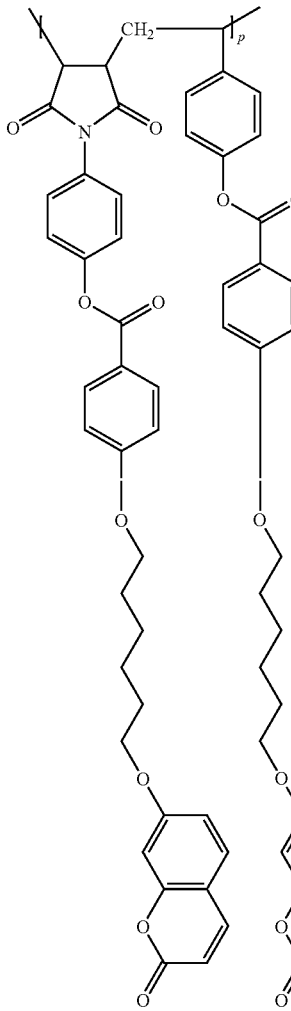

wherein
  p may be as defined in Formula 5;

Formula 7

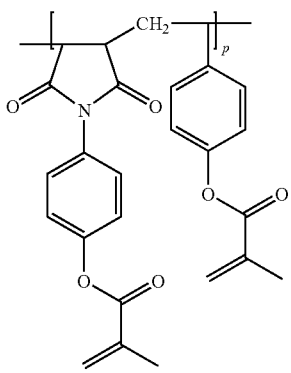

wherein p may be as defined in Formula 5;

Formula 8

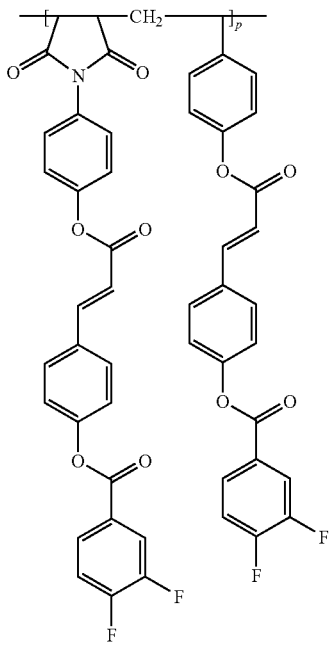

wherein p may be as defined in Formula 5.

The organic insulator composition according to example embodiments may include the above-described organic insulating polymer and an epoxy-based crosslinking agent. The crosslinkability of the organic insulating polymer may be improved by inclusion of a photo-reactive functional group and light (e.g., UV) curing. Additionally, the crosslinkability of the epoxy-based crosslinking agent may be improved through heat curing. When the organic insulator composition is used as a material for the gate insulating layer of an OTFT, the formation of charge traps at an interface between an organic semiconductor layer and an organic insulating layer or the polarization caused by external moisture may be inhibited. Accordingly, the occurrence of hysteresis may be reduced or prevented during the operation of an OTFT.

As a result of the epoxy-based crosslinking agent, the degree of crosslinking as well as the chemical resistance of the organic insulator composition may be improved. For instance, the organic insulator composition may have an increased resistance to the chemicals used in a TFT array fabrication process (e.g., ITO etchant, photoresist stripper). Consequently, a conventional photolithographic process may be used in connection with the organic insulator composition.

The epoxy-based crosslinking agent may include a $C_{3-20}$ substituted or unsubstituted alkyl group, a $C_{3-20}$ substituted or unsubstituted alkoxy group, a $C_{3-20}$ substituted or unsubstituted alkylalkoxy group, a phenyl group, a phenyl alkoxy group, a cyclohexyl group, and/or a cyclohexyl alkoxy group. The substituent may contain fluorine (F) and/or chlorine (Cl).

Examples of the epoxy-based crosslinking agent include, but are not limited to, the compound represented by Formulas 9 and 10 below.

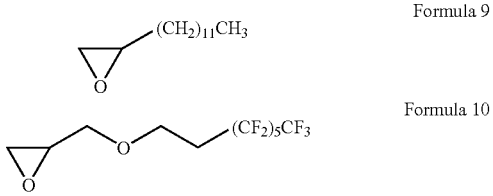

When the amount of the epoxy-based crosslinking agent is less than about 10 parts by weight based on about 100 parts by weight of the organic insulating polymer, enhancement of the chemical resistance of the resulting organic insulator composition may be limited. On the other hand, when the amount of the epoxy-based crosslinking agent exceeds about 50 parts by weight based on about 100 parts by weight of the organic insulating polymer, the resulting organic insulating layer may have a hydrophobic surface which may decrease the performance of the OTFT.

The organic insulator composition may include a solvent to facilitate wet coating. Examples of suitable solvents may include an aliphatic hydrocarbon solvent (e.g., hexane), an aromatic hydrocarbon solvent (e.g., anisole, mesitylene, xylene), a ketone-based solvent (e.g., methyl isobutyl ketone, 1-methyl-2-pyrrolidinone, acetone), an ether-based solvent (e.g., cyclohexanone, tetrahydrofuran, isopropyl ether), an acetate-based solvent (e.g., ethyl acetate, butyl acetate, propylene glycol methyl ether acetate), an alcohol-based solvent (e.g., isopropyl alcohol, butyl alcohol), an amide-based solvent (e.g., dimethylacetamide, dimethylformamide), a silicon-based solvent, and mixtures thereof.

An organic insulating layer may be prepared by applying the organic insulator composition, which may include one or more of the above solvents, on a substrate and performing a curing step. The organic insulating layer may be prepared with a conventional wet coating method. Examples of suitable coating methods may include spin coating, dip coating, printing, spray coating, roll coating, screen printing, and ink spraying, although example embodiments are not limited thereto.

The curing step may be performed with UV irradiation and/or heat treatment. Curing conditions may vary depending on the organic insulating polymer as well as the other constituents of the organic insulator composition. For example, the substrate coated with the organic insulator composition may be subjected to a heat treatment of about 70° C. for about 2 minutes to evaporate the solvent followed by irradiation with UV light to crosslink the organic insulating polymer molecules. The irradiated substrate may be cured further by heating the substrate at a temperature of about 150° C. to 250° C. for about 30 minutes to 2 hours. The organic insulating polymer of Formula 1 according to example embodiments may be cured relatively efficiently with UV light because of a photo-reactive functional group that may be contained in the side chain thereof. The organic insulating polymer may also be cured relatively efficiently with heat because of the addition of the epoxy-based crosslinking agent, thus resulting in a relatively rigid thin film.

The organic insulating layer according to example embodiments may exhibit improved insulating properties. Additionally, the organic insulating layer may be prepared relatively easily with a conventional wet coating process (e.g., printing, spin coating). Furthermore, an OTFT according to example embodiments having the organic insulating layer may exhibit increased charge mobility and an improved current on/off ratio ($I_{on}/I_{off}$).

In the OTFT according to example embodiments, the magnitude of the current between the source electrode and the drain electrode may be determined by the strength of the voltage applied to the gate electrode, independent of the changes in state applied to the OTFT. The OTFT according to example embodiments may exhibit homogeneity rather than hysteresis.

An OTFT according to example embodiments may include the above-described organic insulating layer as a gate insulating layer. For example, the OTFT may include a gate electrode, a gate insulating layer, an organic semiconductor layer, and source/drain electrodes formed on a substrate. The gate insulating layer may include the organic insulator composition according to example embodiments.

The OTFT may have a top contact structure, a bottom contact structure, or a top gate structure, although example embodiments are not limited thereto. Referring to FIG. 1, the OTFT according to example embodiments may have a top contact structure, wherein a gate electrode 20, a gate insulating layer 30, an organic semiconductor layer 40, and source/drain electrodes 50 and 60 may be sequentially formed on a substrate 10. Alternatively, the organic semiconductor layer 40 may be formed on the source/drain electrodes 50 and 60 (not shown).

The substrate 10 may be formed of a material conventionally used in the art, including glass, silicon, polyethylene terephthalate (PET), polycarbonate (PC), polyethersulfone (PES), and/or polyethylene naphthalate (PEN), although example embodiments are not limited thereto.

The organic semiconductor layer 40 may be formed of an organic material conventionally used in the art, including pentacene, copper phthalocyanine, polythiophene, polyaniline, polyacetylene, polypyrrole, polyphenylene vinylene, and/or derivatives thereof, although example embodiments are not limited thereto.

The gate electrode 20, the source electrode 50, and the drain electrode 60 may be formed of a conductive material conventionally used in the art, including gold (Au), silver (Ag), nickel (Ni), indium tin oxide (ITO), aluminum (Al), and chromium (Cr), although example embodiments are not limited thereto.

The gate insulating layer 30 may be formed of the organic insulator composition according to example embodiments. As a result, the gate insulating layer 30 may have increased chemical resistance, thereby improving the fabrication processability of the OTFT. Furthermore, the occurrence of hysteresis during the operation of the OTFT may be reduced or prevented. Accordingly, the OTFT may be useful for the fabrication of various electronic devices, including liquid crystal displays (LCD), photovoltaic devices, organic light-emitting diodes (OLED), sensors, memory, and integrated circuits.

Example embodiments will now be described in further detail below. However, the following examples are merely provided for purposes of illustration and should not to be construed as limiting the scope of the present application.

Preparation of an Organic Insulator Composition

Preparative Example 1

Preparation of an Organic Insulating Polymer (1) Synthesis of 3,4-difluoro-benzoic acid 4-(2-chlorocarbonyl-vinyl)-phenyl ester 10 g (21.68 mmol) of 3,4-difluoro-benzoic acid 4-(2-chlorocarbonyl-vinyl)-phenyl ester was dissolved in 200 ml of methylene chloride, added with 2.84 g (23.848 mmol) of thionyl chloride ($SOCl_2$), stirred at 35° C. for 6 hours, and then vacuum dried to remove the solvent, thus obtaining the desired compound (1) (about 90% yield).

(2) Synthesis of Maleimide-Styrene Copolymer Derivative 2.74 g (9.033 mmol) of polyhydroxymaleimide-polyhydroxystyrene was dissolved in 50 ml of N-methylpyrrolidone (NMP), cooled to 0° C., added with 3.291 g (32.52 mmol) of triethylamine ($Et_3N$), stirred for 30 min, added with 6.995 g (21.679 mmol) of (1) 3,4-difluoro-benzoic acid 4-(2-chlorocarbonyl-vinyl)-phenyl ester, and then stirred at room temperature for 4 hours. The reaction solution was poured into water and methanol, after which the resulting solid was filtered. The solid was washed several times with water and then vacuum dried, thus obtaining the desired compound (2) (about 60% yield).

The reaction scheme for the synthesis of compounds (1) and (2) is represented by Scheme 1 below:

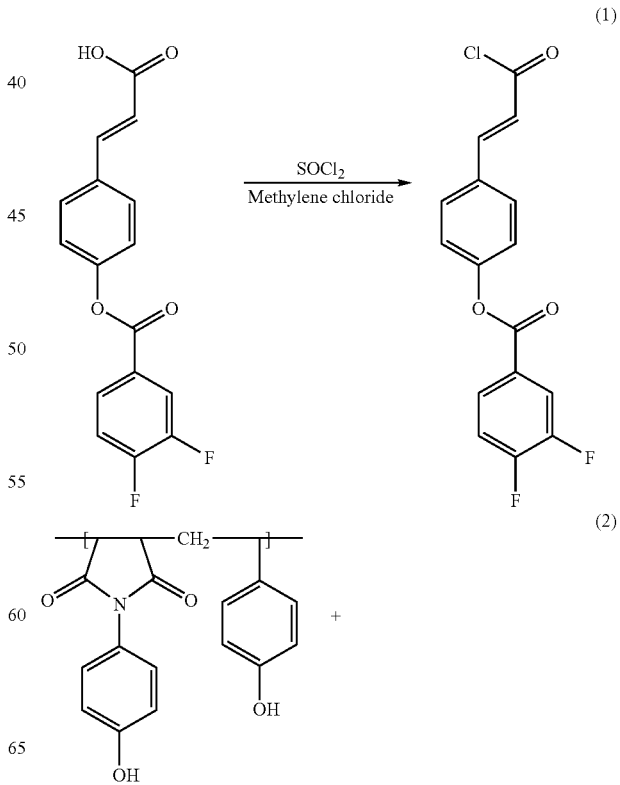

-continued (2)

Preparative Example 2

Preparation of an Organic Insulator Composition 0.2 g of the organic insulating polymer prepared in Preparative Example 1, 0.06 g of 1,2-epoxytetradecane, and 2.34 g of a cyclohexanone solvent were mixed, thus preparing an organic insulator composition.

Comparative Example 1

Preparation of an Organic Insulator Composition

An organic insulator composition was prepared in the same manner as in Preparative Example 2, with the exception that 1,2-epoxytetradecane was not used.

Fabrication of OTFT

Example 1

A gate electrode having a thickness of about 2000 Å was formed on a washed glass substrate by using Al according to a vacuum deposition method. Then, the organic insulator composition synthesized in Preparative Example 1 was subjected to spin coating on the gate electrode and the substrate as illustrated in FIG. 1 and dried at about 70° C. for about 2 minutes to remove the solvent. The substrate was then irradiated at about 200 W with a high pressure mercury lamp having a wavelength range of about 240 nm to about 400 nm for about 2 minutes and heated at about 200° C. for about 1 hour, to thereby form a gate insulating layer having a thickness of about 500 nm to about 1,000 nm.

A polythiophene-based polymer as a semiconductor raw material was dissolved in chloroform at a concentration of about 1% by weight, and the resulting solution was subjected to spin coating on the gate insulating layer formed on the substrate to a thickness of about 50 nm to about 100 nm. The substrate was then heated at about 100° C. for about 1 hour to thereby form an organic semiconductor layer. An OTFT having a top contact structure was prepared by using Au as the source/drain electrodes and by using a shadow mask having a channel length of about 100 μm and a channel width of about 1 mm according to a vacuum deposition method.

Example 2

An OTFT was fabricated in the same manner as in Example 1, with the exception that a gate electrode and a gate insulating layer were formed on a substrate, after which the substrate having the gate electrode and gate insulating layer was dipped into an ITO etchant, e.g., MA-S02 (DongWoo Fine-Chem Co. Ltd.), at about 40° C. for about 1 min and then washed before being coated with an organic semiconductor layer.

Where ITO was used as the source/drain electrodes in the fabrication of a TFT array, the chemical resistance of the gate insulating layer to an ITO etchant composed mainly of hydrochloric acid was evaluated, as described below.

Example 3

An OTFT was fabricated in the same manner as in Example 1, with the exception that a gate electrode and a gate insulating layer were formed on a substrate, after which the substrate having the gate electrode and gate insulating layer was dipped into a photoresist stripper, e.g., PRS-2000 (J. T. Baker), at about 40° C. for about 8 min and then washed before being coated with an organic semiconductor layer.

Where a TFT array was fabricated with a photoresist process, the chemical resistance of the gate insulating layer to the photoresist stripper used for patterning the gate insulating layer and electrodes was evaluated, as described below.

Comparative Example 2

An OTFT was fabricated in the same manner as in Example 1, with the exception that the organic insulator composition prepared in Comparative Example 1 was used.

Comparative Example 3

An OTFT was fabricated in the same manner as in Example 2, with the exception that the organic insulator composition prepared in Preparative Example 1 was used.

[Evaluation of Properties of OTFT]

The current transfer properties of the OTFTs fabricated in Examples 1 to 3 and Comparative Examples 2 and 3 were measured using a semiconductor characterization system 4200-SCS (manufactured by KEITHLEY Instruments Inc.). The results are shown in FIGS. 2 to 6.

Figure 2:
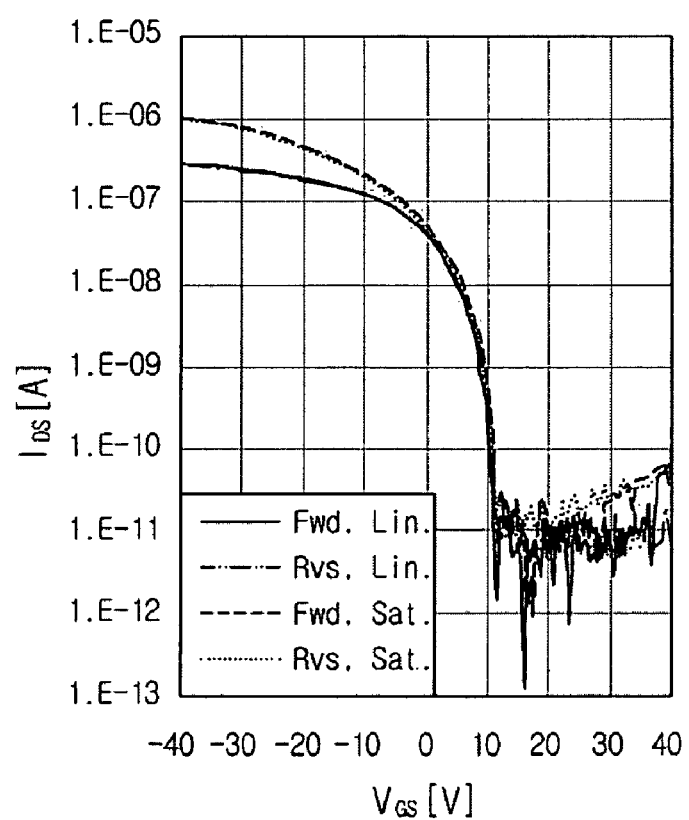
Figure 3:
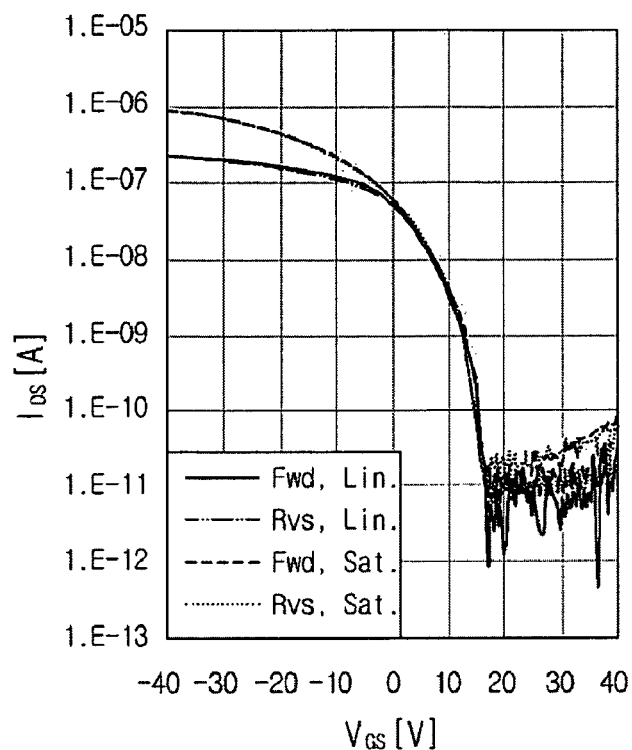
Figure 4:
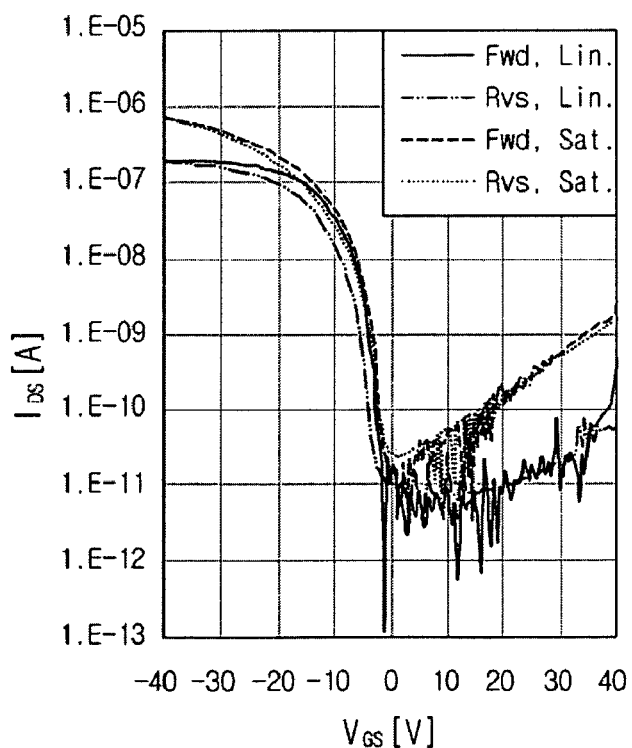
Figure 5:
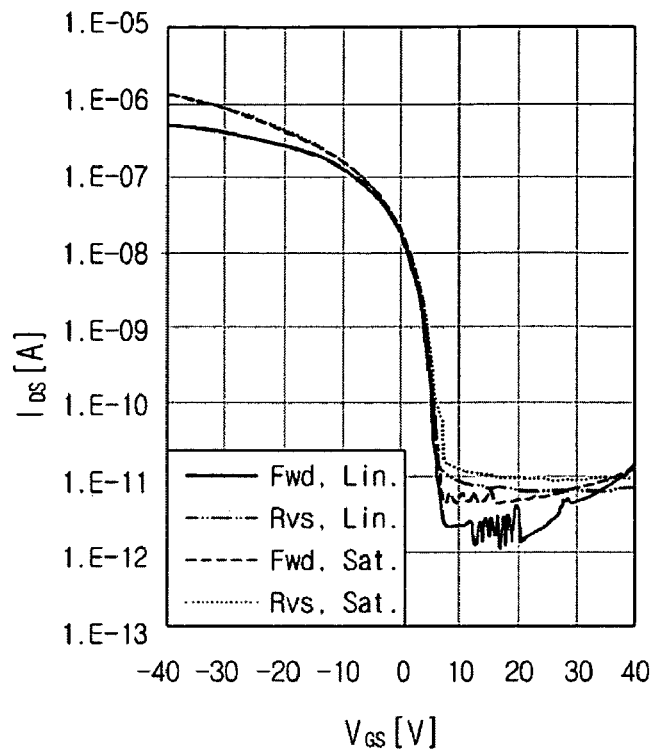
Figure 6:
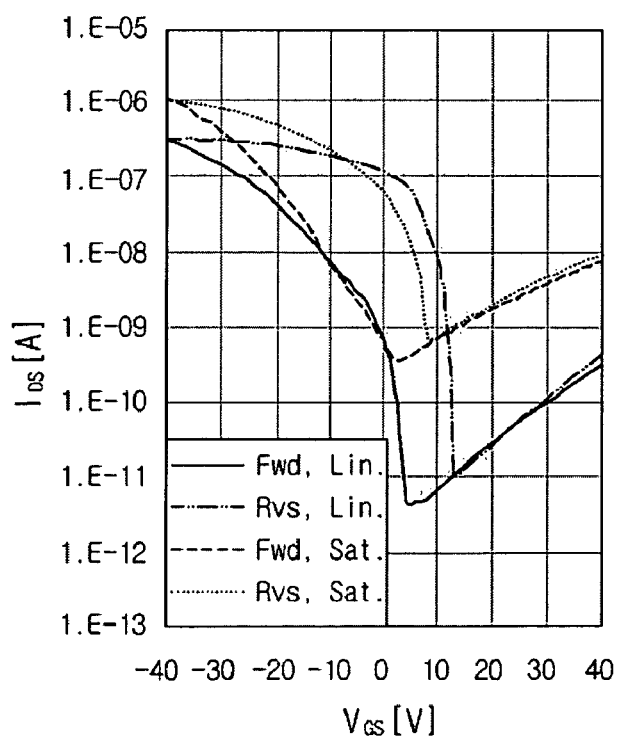

Referring to FIGS. 2 to 4, the OTFTs of Examples 1 to 3 did not show any occurrence of hysteresis. Rather, the OTFTs exhibited relative homogeneity. Thus, even when the ITO etchant treatment (FIG. 3) or the photoresist stripper treatment (FIG. 4) was performed during the process, as in Examples 2 and 3, hysteresis was not observed. Additionally, in the case of Comparative Example 2 (FIG. 5), wherein the composition containing no epoxy-based crosslinking agent was used for the gate insulating layer, hysteresis was not observed. However, in the case of Comparative Example 3 (FIG. 6), wherein the ITO etchant treatment was performed during the process, hysteresis was observed.

The organic insulator composition according to example embodiments may have improved chemical resistance as a result of the epoxy-based crosslinking agent. Accordingly, the occurrence of hysteresis may be reduced or prevented, thus enabling the realization of a relatively homogeneous device.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. An organic insulator composition, comprising:
   an epoxy-based crosslinking agent; and
   an organic insulating polymer represented by Formula 1 below:

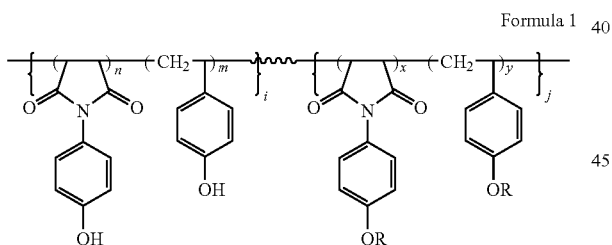

Formula 1 wherein
R is represented by Formula 2 below;
m, n, x, and y are real numbers ranging from about 0.1 to about 0.9;
i and j are each real numbers ranging from about 0 to about 1, with $j \neq 0$;

Formula 2 wherein
$R_1$ is selected from at least one of the functional groups represented by Formula 3 below;
$R_2$ is selected from the photo-reactive functional groups represented by Formula 4 below;
k is an integer ranging from about 0 to about 3; and
if $R_1$ is plural, they are identical to or different from each other;

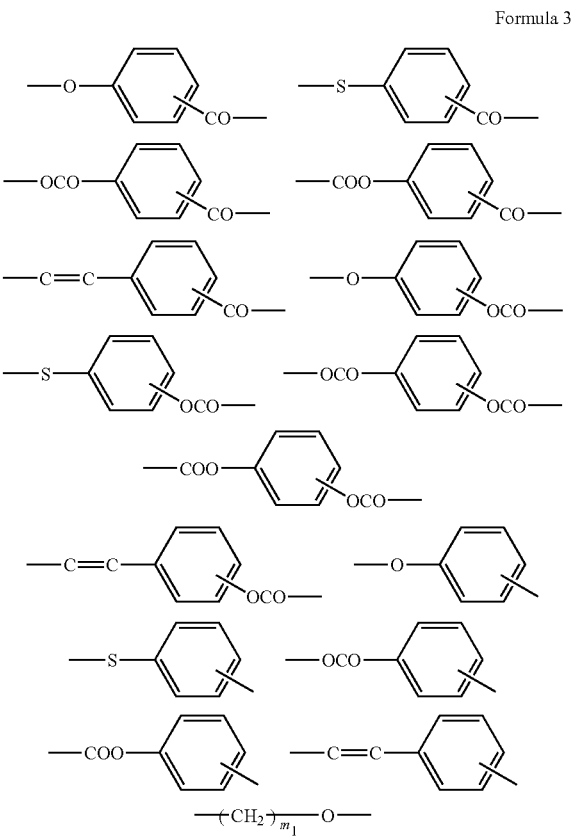

Formula 3 wherein
$m_1$ is an integer ranging from about 1 to about 12;

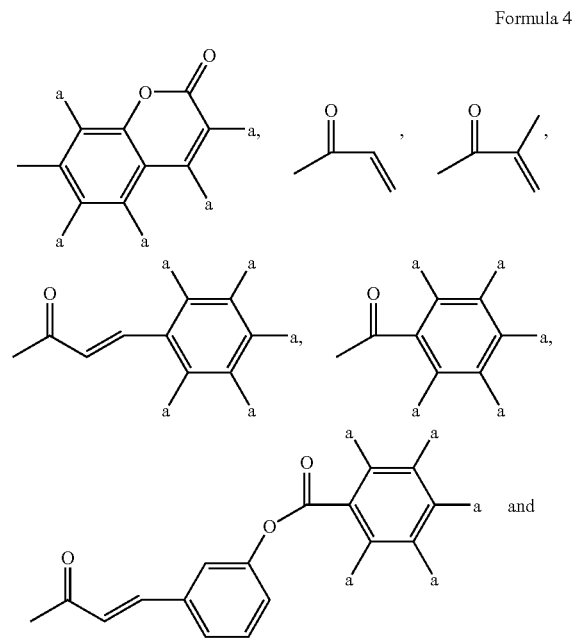

Formula 4

-continued

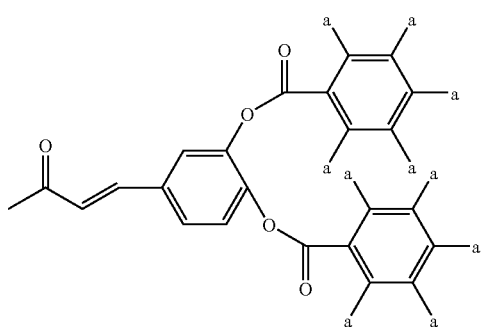

wherein a is selected from at least one of hydrogen, fluorine, chlorine, and a $C_{3-12}$ alkyl group;

wherein the epoxy-based crosslinking went is represented by Formula 10 below:

Formula 10

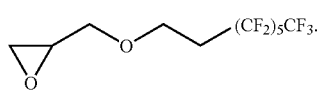

2. The composition of claim 1, wherein the epoxy-based crosslinking agent constitutes about 10-50 parts by weight based on 100 parts by weight of the organic insulating polymer.

3. The composition of claim 1, wherein the sum of m and n is about 1.

4. The composition of claim 1, wherein the sum of x and y is about 1.

5. The composition of claim 1, wherein the sum of i and j is about 1.

6. The composition of claim 1, wherein the organic insulating polymer is further represented by Formula 5 below:

Formula 5

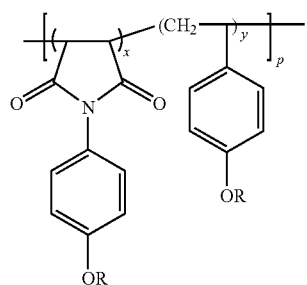

wherein
R is as defined above in Formula 1;
x and y are as defined above in Formula 1; and
p is a real number ranging from about 10 to about 200.

7. The composition of claim 6, wherein the organic insulating polymer is further represented by Formulas 6, 7, or 8 below:

Formula 6

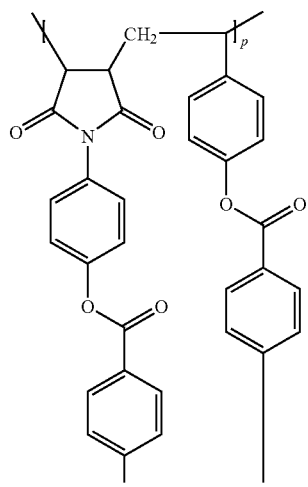

wherein
p is as defined above in Formula 5;

Formula 7

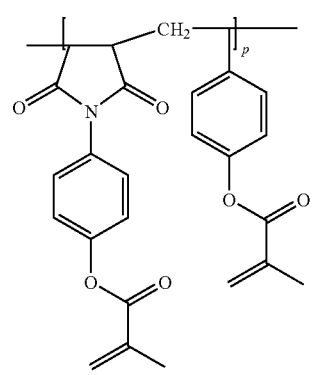

wherein p is as defined above in Formula 5; and

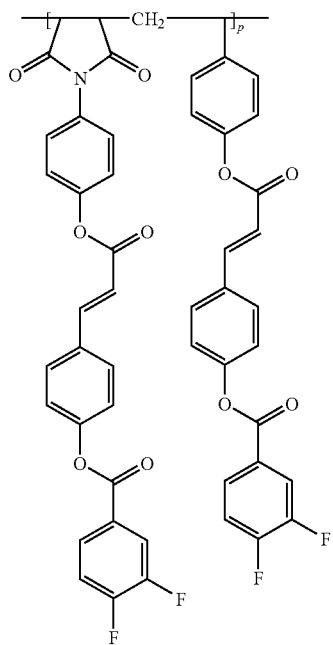

Formula 8 wherein p is as defined above in Formula 5.

8. The composition of claim 1, further comprising:
a solvent selected from at least one of an aliphatic hydrocarbon solvent, an aromatic hydrocarbon solvent, a ketone-based solvent, an ether-based solvent, an acetate-based solvent, an alcohol-based solvent, an amide-based solvent, and a silicon-based solvent.

9. The composition of claim 8, wherein the aliphatic hydrocarbon solvent is hexane.

10. The composition of claim 8, wherein the aromatic hydrocarbon solvent is at least one of anisole, mesitylene, and xylene.

11. The composition of claim 8, wherein the ketone-based solvent is at least one of methyl isobutyl ketone, 1-methyl-2-pyrrolidinone, and acetone.

12. The composition of claim 8, wherein the ether-based solvent is at least one of cyclohexanone, tetrahydrofuran, and isopropyl ether.

13. The composition of claim 8, wherein the acetate-based solvent is at least one of ethyl acetate, butyl acetate, and propylene glycol methyl ether acetate.

14. The composition of claim 8, wherein
the alcohol-based solvent is at least one of isopropyl alcohol and butyl alcohol,
the amide-based solvent is at least one of dimethylacetamide and dimethylformamide.

15. An organic insulating layer comprising the composition of claim 1.

16. An organic thin film transistor comprising the organic insulating layer of claim 15, the organic insulating layer being a gate insulating layer.

17. The organic thin film transistor of claim 16, further comprising:
a substrate
a gate electrode,
an organic semiconductor layer, and
source/drain electrodes,
wherein the gate electrode, gate insulating layer, organic semiconductor layer, and source/drain electrodes are sequentially disposed on the substrate.

* * * * *